(12) United States Patent
Lin et al.

(10) Patent No.: US 10,340,367 B2
(45) Date of Patent: Jul. 2, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yu-Ming Lin, Hsinchu (TW); Ken-Ichi Goto, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/128,479

(22) Filed: Sep. 11, 2018

(65) Prior Publication Data

US 2019/0019882 A1 Jan. 17, 2019

Related U.S. Application Data

(62) Division of application No. 15/429,335, filed on Feb. 10, 2017, now Pat. No. 10,084,066.

(Continued)

(51) Int. Cl.
*H01L 21/8234* (2006.01)
*H01L 29/66* (2006.01)
(Continued)

(52) U.S. Cl.
CPC .... *H01L 29/66795* (2013.01); *H01L 21/0217* (2013.01); *H01L 21/0228* (2013.01); *H01L 21/0262* (2013.01); *H01L 21/02167* (2013.01); *H01L 21/02266* (2013.01); *H01L 21/02271* (2013.01); *H01L 21/02381* (2013.01); *H01L 21/02422* (2013.01); *H01L 21/02521* (2013.01); *H01L 21/02527* (2013.01); *H01L 21/02568* (2013.01); *H01L 21/76805* (2013.01); *H01L 21/76895* (2013.01); *H01L 23/535* (2013.01);
(Continued)

(58) Field of Classification Search
CPC ...................... H01L 21/02167; H01L 21/0217
See application file for complete search history.

(56) References Cited

U.S. PATENT DOCUMENTS 9,368,388 B2 6/2016 Liaw
9,653,464 B1 * 5/2017 Leobandung ....... H01L 27/0886
(Continued)

OTHER PUBLICATIONS

Min-Cheng Chen et al., "Hybrid Si/TMD 2D Electronic Double Channels Fabricated Using Solid CVD Few-Layer-MoS2 Stacking for Vth Matching and CMOS-Compatible 3DFETs", IEE, IEDM, vol. 14, No. 808, (2014), pp. 33.5.1-33.5.4.

(Continued)

*Primary Examiner* — Thao P Le
(74) *Attorney, Agent, or Firm* — McDermott Will & Emery LLP

(57) ABSTRACT

A semiconductor device including a Fin FET device includes a fin structure protruding from a substrate layer and having a length extending in a first direction. A channel layer is formed on the fin structure. A gate stack including a gate electrode layer and a gate dielectric layer extending in a second direction perpendicular to the first direction is formed over the channel layer covering a portion of the length of the fin structure. The source and drain contacts are formed over trenches that extend into a portion of a height of the fin structure.

20 Claims, 8 Drawing Sheets

Related U.S. Application Data

(60) Provisional application No. 62/427,468, filed on Nov. 29, 2016.

(51) Int. Cl.

| | |
|---|---|
| *H01L 21/02* | (2006.01) |
| *H01L 21/768* | (2006.01) |
| *H01L 23/535* | (2006.01) |
| *H01L 29/10* | (2006.01) |
| *H01L 29/16* | (2006.01) |
| *H01L 29/24* | (2006.01) |
| *H01L 29/78* | (2006.01) |

(52) U.S. Cl.
CPC ...... *H01L 29/1037* (2013.01); *H01L 29/1606* (2013.01); *H01L 29/24* (2013.01); *H01L 29/66545* (2013.01); *H01L 29/785* (2013.01)

(56) References Cited

U.S. PATENT DOCUMENTS

| | | | |
|---|---|---|---|
| 9,673,293 B1* | 6/2017 | Cheng | H01L 29/4991 |
| 9,721,843 B2* | 8/2017 | Chou | H01L 21/845 |
| 9,805,982 B1* | 10/2017 | Zang | H01L 21/823456 |
| 2010/0123201 A1 | 5/2010 | Jeon et al. | |
| 2011/0193157 A1 | 8/2011 | Juengling | |
| 2014/0273379 A1 | 9/2014 | Tsai et al. | |
| 2015/0206890 A1 | 7/2015 | Liaw | |
| 2016/0322475 A1* | 11/2016 | Leobandung | H01L 29/66795 |
| 2019/0019882 A1* | 1/2019 | Lin | H01L 21/02167 |

OTHER PUBLICATIONS

Office Action issued in related U.S. Appl. No. 15/429,335, dated Aug. 11, 2017.
Non-Final Office Action issued in related U.S. Appl. No. 15/429,335, dated Nov. 17, 2017.
Notice of Allowance issued in related U.S. Appl. No. 15/429,335, dated May 16, 2018.

* cited by examiner

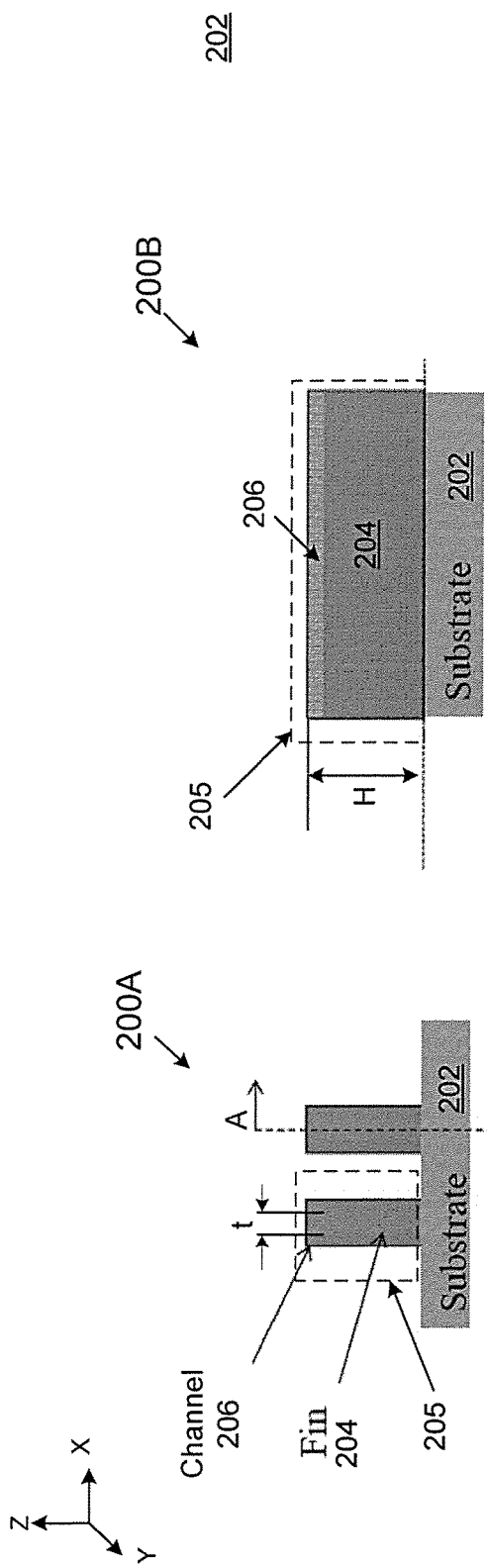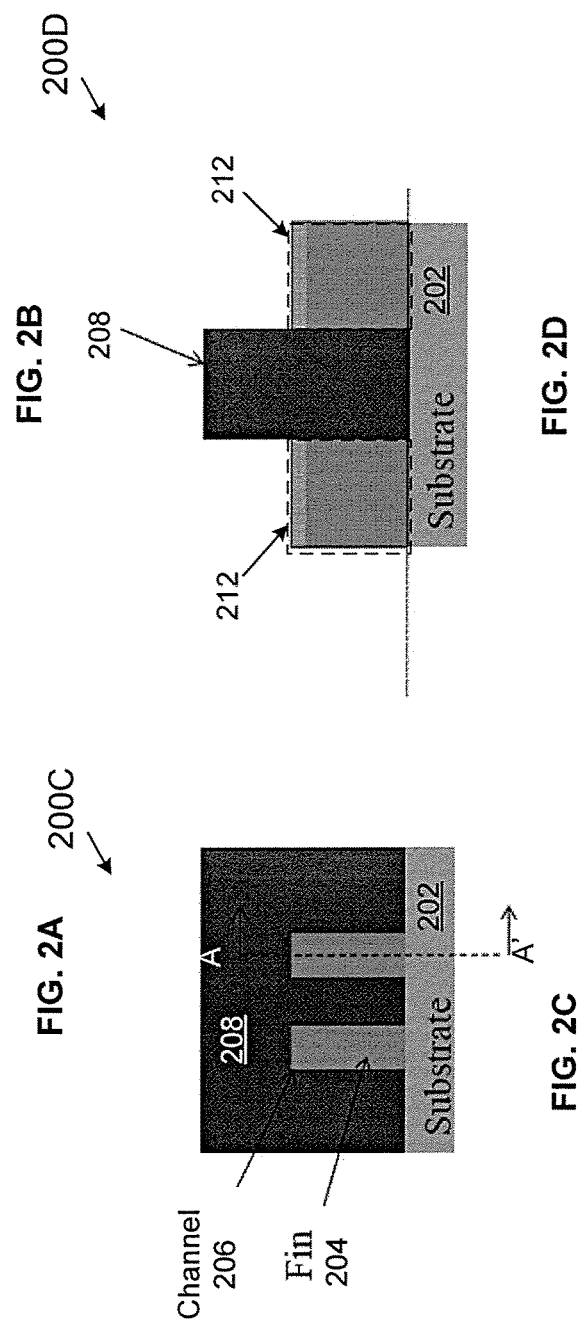
FIG. 2A
FIG. 2B
FIG. 2C
FIG. 2D

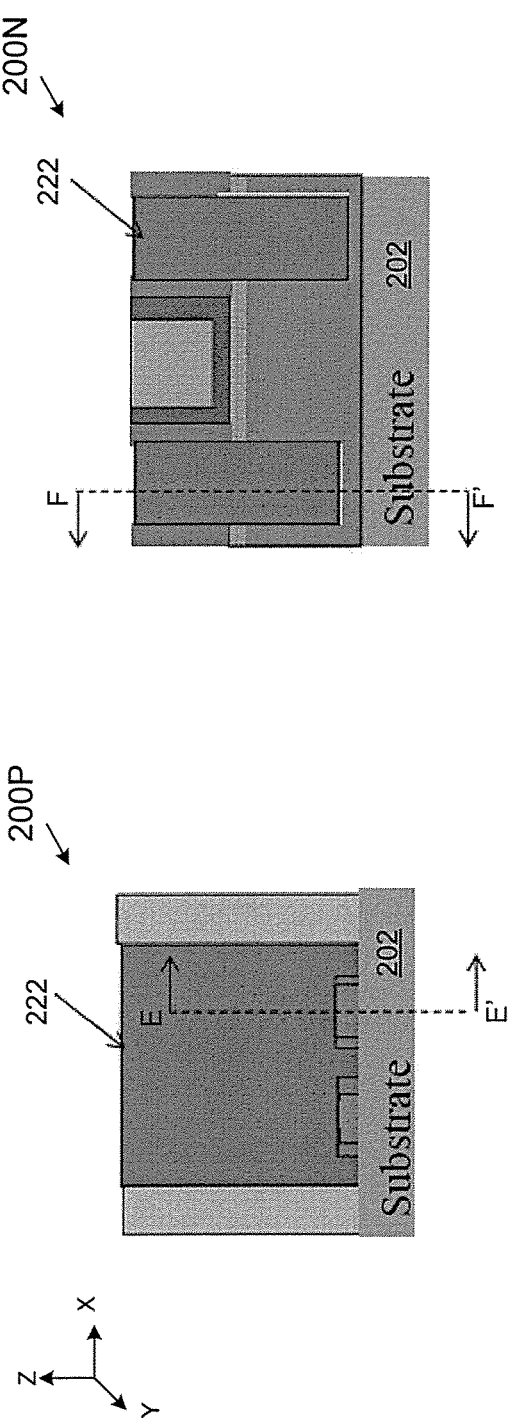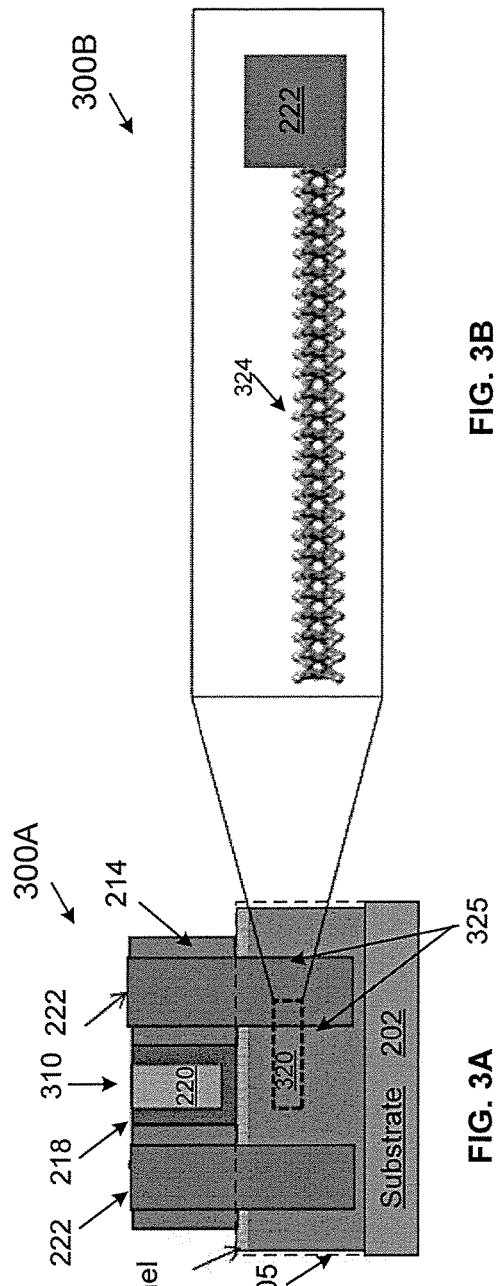

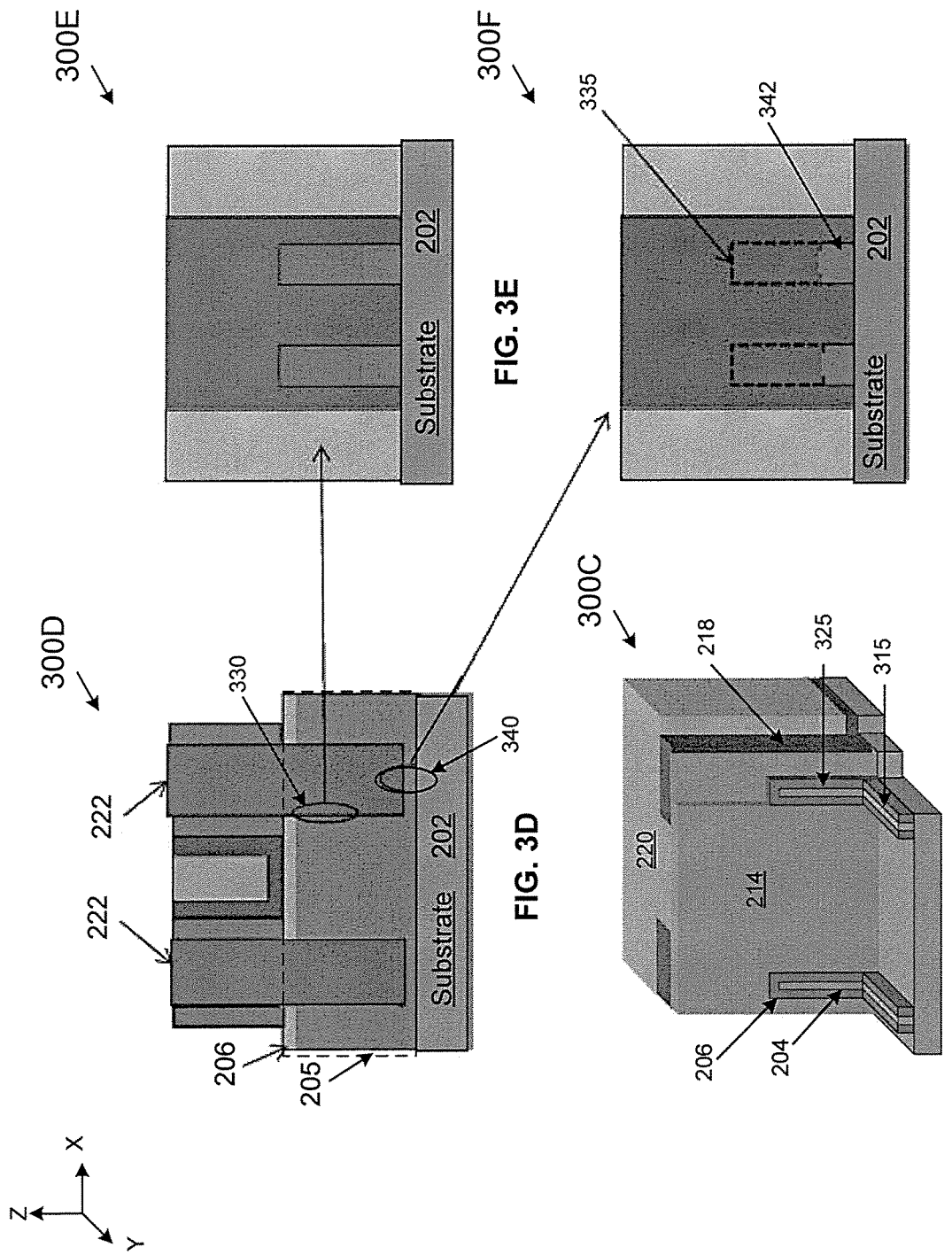

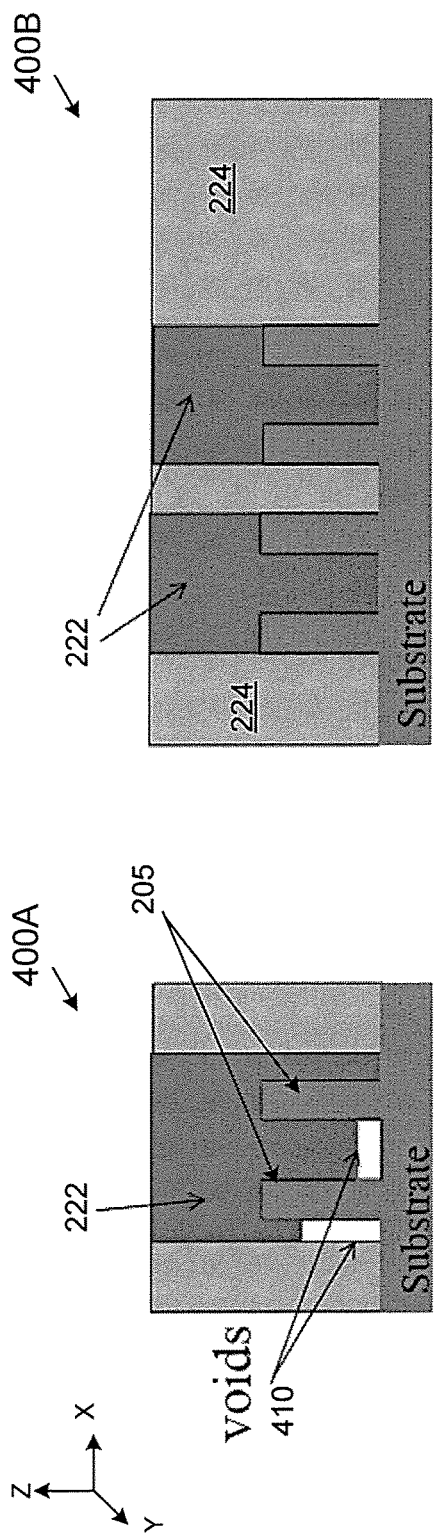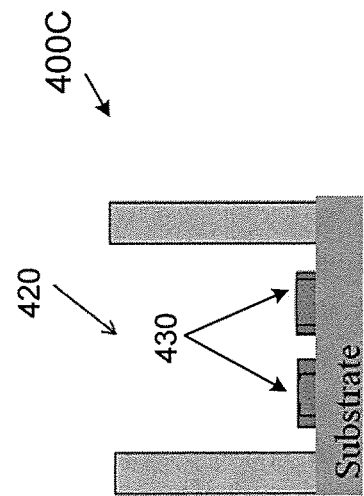
FIG. 4A
FIG. 4B
FIG. 4C

SEMICONDUCTOR DEVICE AND MANUFACTURING METHOD THEREOF

CROSS-REFERENCE TO RELATED APPLICATIONS

The present application is a Divisional application claiming the benefit of and priority of U.S. patent application Ser. No. 15/429,335 filed on Feb. 10, 2017, which claims the benefit of priority under 35 U.S.C. § 119 from U.S. Provisional Patent Application 62/427,468 filed Nov. 29, 2016, which is incorporated herein by reference in its entirety.

TECHNICAL FIELD

The disclosure relates to a semiconductor integrated circuit, and more particularly to a contact structure and manufacturing method for a 2-dimensional (2D) FinFET.

BACKGROUND

As the semiconductor industry has progressed into nanometer technology process nodes in pursuit of higher device density, higher performance, and lower costs, challenges from both fabrication and design issues have resulted in the development of three-dimensional designs, such as fin field-effect transistors (Fin FETs). In a Fin FET, the transistor channel rises above the planar substrate to form a fin structure, with a gate electrode adjacent to two side surfaces and the top surface of a channel region with a gate dielectric layer interposed between them.

In some field-effect transistors, at least part of the channel consists of 2D semiconductors formed around the fin structure. It is known that contact parasitic resistance is a limiting factor for achieving high performance in devices based on 2D materials, in particular as the device dimension becomes smaller. The contact resistance is inversely proportional to the contact area, which is expected to shrink as the device down-scaling continues. For 2D materials, the contact resistance is related to contact length corresponding to the perimeters between contact metal and the 2D material. In addition, in a FinFET design, the contact metal may need to be filled in a narrow trench, typically at high aspect ratio, which can present a process challenge. This is because the trend for the aspect ratio is to increase and for the trench opening is to decrease at more advanced technology nodes.

2D FinFET devices having 2D thin-film channels supported by 3D fin structures are known to have improved drive currents. The 2D FinFET device, however, faces similar issues, as explained above, with regard to contact resistance. Solutions are required that can efficiently reduce the contact resistance to improve overall performance, while at the same time alleviate the process challenges for making contact as the device dimension shrinks, such as the difficulty associated with metal filling in high aspect ratio trenches.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, 2F, 2G, 2H, 2I, 2J, 2K, 2L, 2M, 2N, and 2O are exemplary two-dimensional views showing various processes for manufacturing of a two-dimensional (2D) Fin FET device according to one or more embodiments of the present disclosure.

FIGS. 3A, 3B, 3C, 3D, 3E, and 3F are diagrams illustrating structural details of a two-dimensional (2D) Fin FET device according to one or more embodiments of the present disclosure.

FIGS. 4A, 4B, and 4C are diagrams illustrating advantageous features of the disclosed method for manufacturing a two-dimensional (2D) Fin FET device according to one or more embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed, interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The device may be otherwise oriented (rotated 90 degrees or at other orientations), and the spatially relative descriptors used herein may likewise be interpreted accordingly. In addition, the term "made of" may mean either "comprising" or "consisting of."

Figure 1:
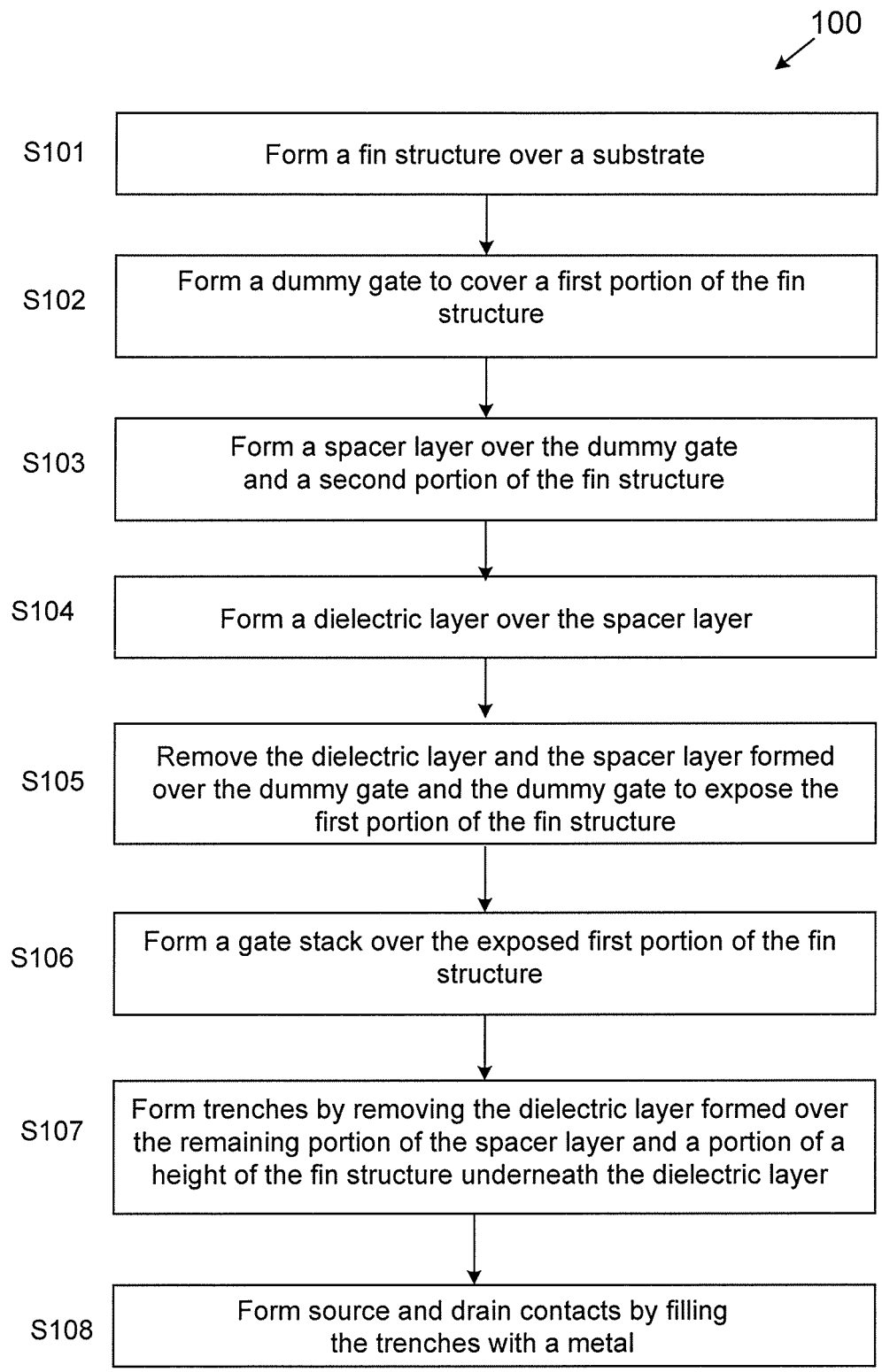
FIG. 1 is an exemplary process flow chart for manufacturing a two-dimensional Fin FET device according to one or more embodiments of the present disclosure.

FIG. 1 is an exemplary process flow chart 100 for manufacturing a 2D Fin FET device, according to one or more embodiments of the present disclosure. The flow chart 100 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

In S101 of FIG. 1, a fin structure 205 is formed over a substrate 202, as shown in a Y-cut view 200A FIG. 2A. The substrate can be, for example, a p-type silicon substrate with an impurity concentration in a range of about $1 \times 10^{15}$ cm$^{-3}$ to about $3 \times 10^{15}$ cm$^{-3}$ in some embodiments. In other embodiments, the substrate is an n-type silicon substrate with an impurity concentration in a range of about $1 \times 10^{15}$ cm$^{-3}$ to about 3×10$^{15}$ cm$^{-3}$. The Si substrate has a (100) upper surface in some embodiments.

Alternatively, the substrate may comprise another elementary semiconductor, such as germanium, a compound semiconductor including Group IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate is a silicon layer of an SOI (silicon-on-insulator) substrate. Amorphous substrates, such as amorphous Si or amorphous SiC, or insulating material, such as silicon oxide, may also be used as the substrate. The substrate may include various regions that have been suitably doped with impurities (e.g., p-type or n-type conductivity).

Forming the fin structure 205 starts with forming the fin 204 using known methods and similar material of the substrate 202. In some embodiments, the fin 204 can be formed using silicon, silicon dioxide (SiO$_2$), or silicon covered with a dielectric material. In some aspects, the dielectric material can be one of boron nitride (BN), alumina (Al$_2$O$_3$), hafnium oxide (HfO$_2$), or other dielectric materials. As shown in an X-cut view 200B of FIG. 2B (e.g., cut across AA' of FIG. 2A), the fin can have a height H, for example, within the range of about 10-100 nm, in some embodiments. The width t of the fin, as shown in the Y-cut view 200A of FIG. 2A, is within the range of about 1-20 nm, in some embodiments.

The fin structure 205 includes the fin 204 and a channel layer 206 formed over the fin 204. In some embodiments, the channel layer 206, shown in the Y-cut view 200A and in the X-cut view 200B, is a 2D channel formed from a 2D material. Examples of 2D materials include graphene, black phosphorus, borophene, silicene, germanene, and the like, which are 2D allotropes of base elements such as carbon, phosphorus, boron, silicon, germanium, etc. Other 2D materials include more than one elements, such as transition metal di-chalcogenides, where transition metal atoms (e.g. Mo, W, Hf, Zr) are sandwiched between chalcogen atoms (e.g. S, Se, Te) to form a 2D crystal consisting of three layers of atoms that are covalently bonded. The 2D materials may also include stacks of multiple layers of aforementioned 2D crystals, with van der Waals interactions between layers. The stack may comprise of layers of the same 2D crystals or combination of different 2D crystals for each layer.

Two dimensional materials, such as transition metal dichalcogenide (TMD), graphene, and black phosphorus are regarded as promising candidates for transistor channels in future devices. In some aspects, the disclosed 2D channel can be a 2D semiconductor including a TMD, such as molybdenum disulfide (MoS$_2$). The 2D semiconductor may include one or more layers and can have a thickness within the range of about 0.5-100 nm, in some embodiments. One advantageous feature of the 2D semiconductor is the high electron mobility ($\mu_e$) value or hole mobility ($\mu_h$), which is within a range of about 1-10,000 cm$^2$/V-sec. It is understood that the bulk silicon, when cut to a low thickness (e.g., about 2 nm) comparable with a typical thickness of a 2D material film, can have its mobility degraded drastically.

Is some embodiments, the channel 206 is deposited selectively on the fin 204 and not on the substrate 202. Various deposition methods such as the chemical-vapor deposition (CVD) method or the atomic-layer deposition (ALD) method can be used to form the channel layer 206. The deposition process can be selective if the fin 204 is made of a different material than the substrate, as the material for the channel layer 206 may be chosen such that the selected material does not adhere to the substrate. In case the fin is formed from the same material as the substrate, formation of a thin oxide film on the fin 204, for example, can facilitate the selective deposition of the channel layer 206.

In S102 of FIG. 1, a dummy gate 208 is formed to cover a first portion of the fin structure 205, as shown in a Y-cut view 200C of FIG. 2C and an X-cut view 200D of FIG. 2D (e.g., cut across AA' of FIG. 2C). The dummy gate 208 can include, for example, amorphous silicon or other silicon compounds and can be deposited using known deposition methods including CVD, such as the plasma enhanced CVD (PECVD) deposition method. As shown in the X-cut view 200D, the dummy gate 208 covers the first portion of the fin structure 205 and leaves the second portion 212 of the fin structure 205 exposed.

Figure 2E:
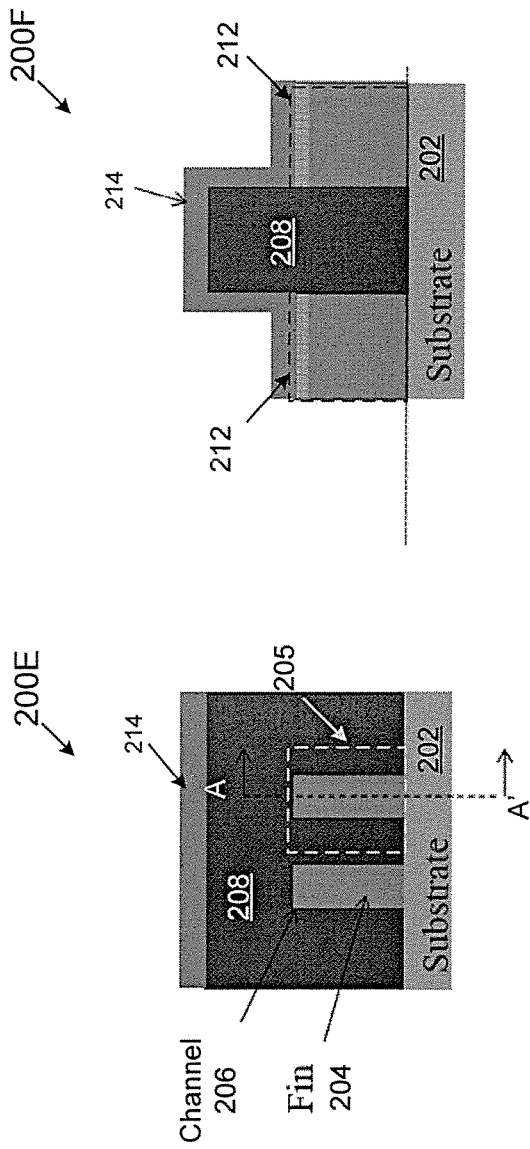
Figure 2F:
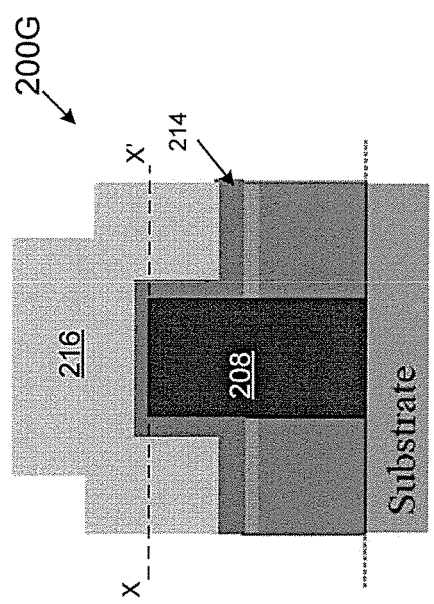

In S103 of FIG. 1, a spacer layer 214 is formed over the dummy gate 208 and the second portion 212 of the fin structure 205, as shown in a Y-cut view 200E of FIG. 2E and an X-cut view 200F of FIG. 2F (e.g., cut across AA' of FIG. 2E). In some aspects, the spacer 214 is a layer of suitable nitride such as silicon nitride (SiN) or silicon carbon nitride (SiCN), although other suitable materials can be used. The spacer layer 214 can be deposited using known deposition methods, such as CVD, ALD, or physical vapor deposition (PVD). In some embodiments, prior to the formation of the spacer layer 214, the exposed channel layer (e.g., the 2D channel) is first treated by doping with, for example, chlorine ions (Cl$^-$). In some embodiments, chlorine ions are introduced in the form of a solution (e.g., an iron chloride solution), or by spraying or dip-coating the solution over the exposed channel layer. This treatment allows the chlorine ion to adhere to the 2D material of the channel layer 206 such that the channel layer 206 is doped or becomes metallic.

Figure 2G:
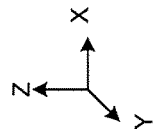

In S104 of FIG. 1, a dielectric layer 216 is formed over the spacer layer 214, as shown in an X-cut view 200G of FIG. 2G. In some embodiments, the dielectric layer 216 is a first inter-layer deposition (ILD0) layer including, for example, silicon dioxide (SiO$_2$). In some aspects, the dielectric layer 216 can be deposited using known deposition methods such as CVD, PVD, or ALD.

Figure 2H:
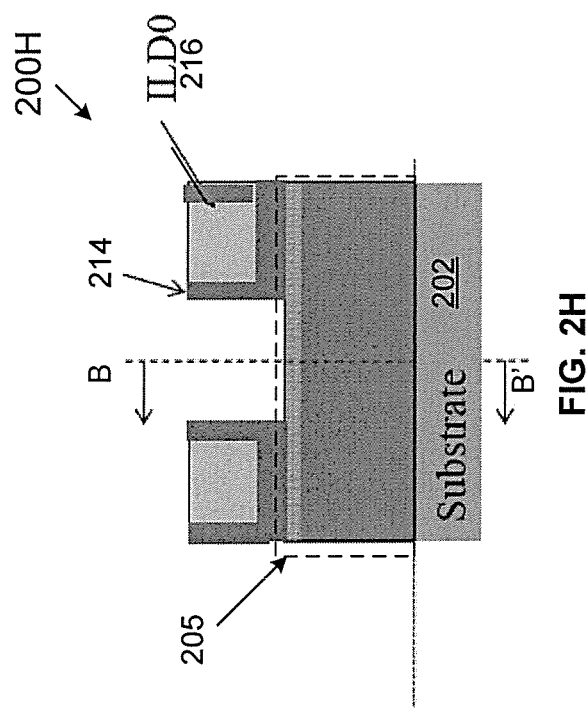
Figure 2I:
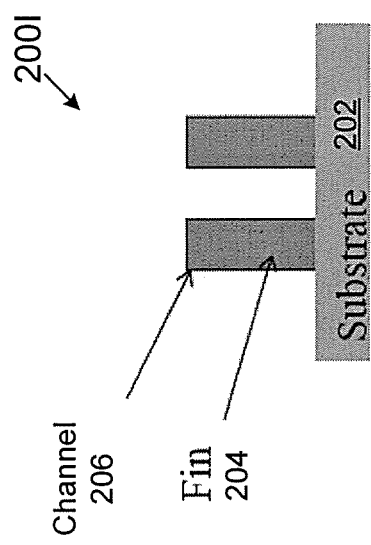

In S105 of FIG. 1, a portion of the dielectric layer 216 and the spacer layer 214 over the dummy gate 208 and the dummy gate 208 are removed to expose the first portion of the fin structure that was covered by the dummy gate 208, as shown in an X-cut view 200H of FIG. 2H and a Y-cut view 200I of FIG. 2I (e.g., cut across BB' of FIG. 2H). The removal of the dielectric layer 216 and the spacer layer 214 is performed by a planarization operation.

The planarization operation, for example, a planarization process includes a chemical mechanical polishing (CMP) method and/or an etch-back process, so as to remove a part of the dielectric layer 216 and the spacer layer 214 formed over the dummy gate 208, for instance, down to a level shown by a line XX' in FIG. 2G. After the planarization process, the dummy gate is removed by trench etching using, for example, a dry etching method and/or a wet etching method. The in-process device after the planarization process is shown in the X-cut view 200H and the Y-cut view 200I. The exposed portion of the fins structure 205 is ready for deposing of the gate stack.

Figure 2J:
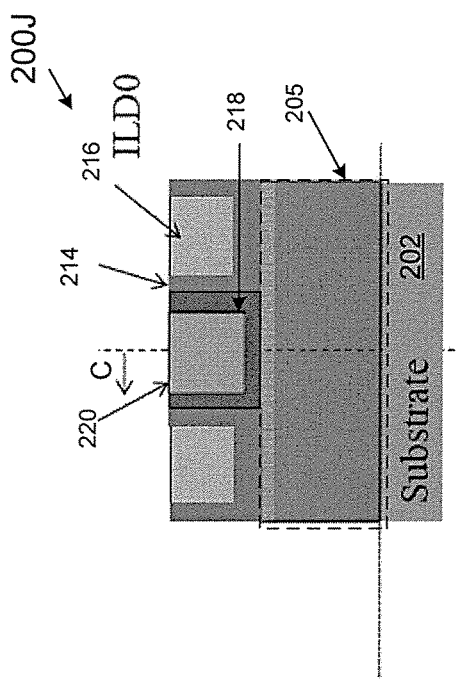
Figure 2K:
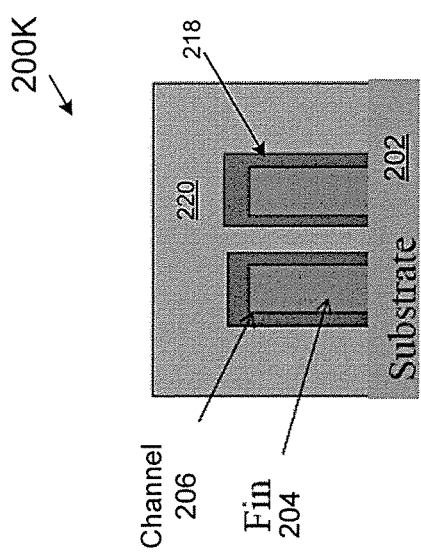

In S106 of FIG. 1, a gate stack is formed over the exposed first portion of the fin structure 205, as shown in an X-cut view 200J of FIG. 2J and a Y-cut view 200K of FIG. 2K (e.g., cut across CC' of FIG. 2J). The gate stack includes a gate electrode layer 220 and a gate dielectric layer 218 formed over the exposed first portion of the fin structure 205. The gate electrode layer 220 can be metal or poly silicon in some embodiments. The gate dielectric layer may include silicon oxide formed by CVD, PVD, ALD (atomic layer deposition), e-beam evaporation, or other suitable processes.

In one or more embodiments, a gate-last technology (a gate replacement technology) is employed. In the gate-last technology, the gate electrode layer 220 and the gate dielectric layer 214 formed in the foregoing operations replace the dummy gate of FIG. 2F or 2G, which were removed at operation S105 of FIG. 1, as shown in FIG. 2H.

In some embodiments, the gate dielectric layer 218 includes one or more layers of silicon oxide, silicon nitride, silicon oxy-nitride, or high-k dielectric materials. High-k dielectric materials comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the thickness of the gate dielectric layer 224 is in the range of about 1 nm to about 5 nm. In some embodiments, the gate dielectric layer 224 includes an interfacial layer made of silicon dioxide. In other embodiments, the gate electrode layer 220 includes a single layer or a multilayer structure.

Further, the gate electrode layer 220 may be doped poly-silicon with uniform or non-uniform doping. In some alternative embodiments, the gate electrode layer 220 includes a metal such as Al, Cu, W, Ti, Ta, Pd, Co, TiN, TiAl, TiAlN, TaN, NiSi, CoSi, and other conductive materials with a work function compatible with the substrate material, or combinations thereof. The electrode layer for the gate electrode layer 220 may be formed using a suitable process such as ALD, CVD, PVD, plating, or combinations thereof. The width of the gate electrode layer 220 (in the X direction) is in the range of about 5 nm to about 60 nm in some embodiments.

After formation, the gate stack, the in process device shown in the X-cut view 200J, is patterned using suitable mask layers to remove the dielectric layer 216 and portions of the fin structure 205, as described in more details herein.

Figure 2M:
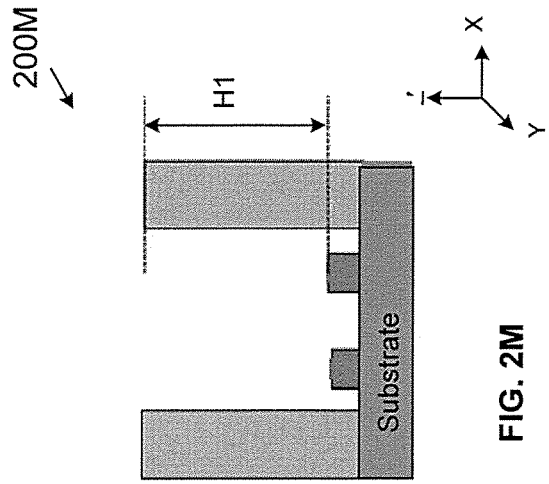
Figure 2L:
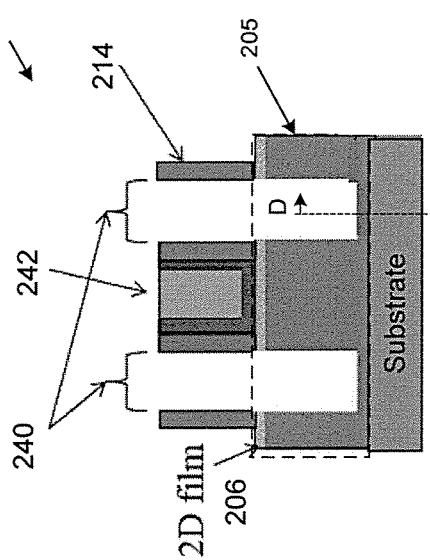

In S107 of FIG. 1, trenches 240 are formed by removing the dielectric layer 216 formed over the remaining portion of the spacer layer 214 and a portion of the height H1 of the fin structure 205 underneath the dielectric layer 214, as shown in an X-cut view 200L of FIG. 2L and a Y-cut view 200M of FIG. 2M (e.g., cut across DD' of FIG. 2L). The removal can be performed by trench etching using a dry etching method and/or a wet etching method. The opening of the trenches 240 is for the source and drain contact metals as explained in more details herein. The removal of the height H1 of the fin structure 205 is one of the features of the subject technology that allows a side-contact with metal for the 2D channel. In some embodiments, the removed height H1 of the fin structure 205 is at least about 30% of the height of the fin structure 205 that is in the range of about 10 nm to 100 nm. Accordingly, at least a portion with height H1 of 15 nm is removed from the fin structure 205.

In S108 of FIG. 1, source and drain contacts 222 are formed by filling the trenches 240 of FIG. 2L with a metal, as shown in an X-cut view 200N of FIG. 2N and a Y-cut view 200P of FIG. 2O (e.g., cut across FF' of FIG. 2N). It is to be noted the X-cut view 200N is itself a cut across EE' of FIG. 2O. In one or more implementations, example metals that can be used for the source and drain contacts include Al, Cu, W, Ti, Ta, Pd, Sc, Ni, Co, Ru, TiN, TiAl, TiAlN, TaN, NiSi, CoSi, and other conductive materials, or combinations thereof. In some implementations, the source and drain contacts 222 can be deposited using, for example, ALD, CVD, PVD, or other suitable deposition techniques. In some embodiments, an optional anneal process, for example, at a temperature within the range of about 150-650 degrees C. can be performed to improve the metal-to-channel contact resistance. The process concepts described above can be integrated into the present Fin FET fabrication process, and can be implemented in a number of technology nodes, including but not limited to 10, 7, and 5-nm technology nodes.

FIGS. 3A, 3B, 3C, 3D, 3E, and 3F are diagrams illustrating structural details of a 2D Fin FET device 300A according to one or more embodiments of the present disclosure. The 2D Fin FET device 300A includes a fin structure 205 that protrudes from a substrate layer 202 and has a length extending in a first direction (e.g., X). The channel layer 206 is formed on the fin structure 205, and a gate stack 310 including a gate electrode layer 220 and a gate dielectric layer 218 extending in a second direction (e.g., Y) perpendicular to the first direction (e.g., X) formed over the channel layer. The gate stack 310 covers a portion of the length of the fin structure 205. The channel layer 206 is a thin layer (e.g., with thickness within the range of 0.5 to 10 nm) of a 2D semiconductor (e.g., $MoS_2$). The height of the fin structure 205 is within the range of about 10 to 100 nm, and the source and drain contacts are formed over trenches (e.g., 240 of FIG. 2L) that extend into at least about 30% of the height of the fin structure 205.

One of the advantageous features of the disclosed 2D Fin-FET device is the side-contact between the metal 222 of the source and drain contacts with the channel layer 206 of the fin structure. For example, the channel 206 has the contacts at sides 325 with the metal 222, compared to a traditional 2D Fin-FET device, which does not include the trenches (e.g., 240 of FIG. 2L) for metal 222 to extend into the fin structure 205 (e.g., of FIG. 2L).

A blown-up view 300B of a section 320 of FIG. 3A is shown in FIG. 3B. The blown up view 300B depicts a side contact between the source and drain contact metal 222 with the 2D channel material 324 (e.g., $MoS_2$) of the channel layer 206. As shown, the contact metal 222 bonds to the molecule of the $MoS_2$ material. The side contact allows for improved contact resistance when compared to the top-contact scheme in a conventional 2D Fin-FET device, which does not include the trenches (e.g., 240 of FIG. 2L) for metal 222 to extend into the fin structure 205 (e.g., of FIG. 2L). The 2D channel material 324 can have a charge carrier (e.g., electron) mobility ($\mu_e$) value within a range of about 1-10,000 cm2/Vsec, and can maintain its high mobility at low thicknesses (e.g., less than 5 nm). It is understood that the bulk silicon, at thicknesses of less than about 5 nm mobility will have a drastic (e.g., about 50%) degradation in charge carrier mobility.

A three-dimensional (3D) view 300C depicted in FIG. 3C includes a cross-sectional view of the fin structure that shows the fin structure before metal contact formation. The 3D view 300C shows the gate electrode 220, the gate dielectric layer 218, spacer layer 214, the channel 206, and the fin 204. The cross section view of the fin structure reveals that the source and drain contact metal 222, not only are in contact with the bottom surface (e.g., in the XY plane) 315 of the channel 206, but is additionally in contact with a side surface 325 of the channel.

In some implementations, the subject technology can reduce the contact resistance of the source and drain metals of the 2D channel to a range of less than about 100 ohm-micron ($\Omega$-$\mu$m) from a normal range of about 1-10 K Ω-μm. Achieving a low-contact residence for the source and drain metals to the 2D channel is particularly difficult at advanced technology nodes, for example, less than 50 nm. The disclosed solution, although not limited to particular technology node, can solve the problem of contact residence at low feature sizes.

FIG. 3D shows an X-cut view 300D, which is similar to the X-cut view showing the fin FET device 300A and shows two spots 330 and 340 at the junction of the contact metal 222 and the channel 206 that are shown in exploded views 300D and 300E, respectively. The exploded view 300E is a Y-cut view that shows contact at the side wall of the trench in the fin structure 205, where the entire height of the fin structure 205 is viewable. The exploded view 300F is a Y-cut view that shows contact at the bottom of the trench in the fin structure 205, where the reduced height 342 (e.g., reduced by at least about 30%) of the fin structure 205 is viewable. The dotted line 335 shows the original height of the fin structure 205.

FIGS. 4A, 4B, and 4C are diagrams illustrating advantageous features of the disclosed method for manufacturing a 2D Fin FET device according to one or more embodiments of the present disclosure. The Y-cut view 400A depicts an example situation of a narrow-pitch Fin-FET device implemented using the conventional method. Due to the high aspect-ratio (e.g., height/width) of the trenches, for example, the narrow gap between the fin structure and the sidewall of the opening, voids 410 are produced in the metal filing that prevent the metal 222 from fully contacting the sidewall of the fin structures 205, thus reducing the effective contact length between the contact metal and the 2D channel. The reduced contact length results in undesirable effects such as an increased source and drain contact resistance and unreliability of the Fin FET device.

The Y-cut view 400B depicts another example situation of a narrow-pitch Fin-FET device implemented using the conventional method, where the distance between two neighboring metals 222 is short and the metal can only contact one side of the fin structure. This results in further reduced contact length between the metal 222 and the 2 channels of the fin structure.

The Y-cut view 400C depicts a corresponding opening 420 for source and drain metal contacts of the subject technology as shown in FIG. 2O. The opening 420 allows for a full contact area between source and drain metal and the 2D channel, as the height of the fin structure is reduced (e.g., by at least 30%), resulting in lower aspect ratio openings on the side of the reduced height fin structures 430, which allow filling of the metal 222 without defects such as voids. Further, the subject technology increases the contact length between the metal 222 and the 2D channel (e.g., 206), as shown and discussed above with respect to FIG. 3A.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a fin structure. A spacer layer is formed over a dummy gate formed over a first portion of a fin structure, and a second portion of the fin structure. A dielectric layer is formed over the spacer layer. The dielectric layer and the spacer layer formed over the dummy gate and the dummy gate are removed to expose the first portion of the fin structure. A gate stack is formed over the exposed first portion of the fin structure. Trenches are formed by removing the dielectric layer formed over the remaining portion of the spacer layer and a portion of a height of the fin structure underneath the dielectric layer, and source and drain contacts are formed by filling the trenches with a metal.

In some implementations, the fin structure and the dummy gate are formed prior to forming the spacer layer and forming the fin structure includes forming a 2D channel including a 2D material over a fin that is formed on a substrate. The 2D material includes a 2D semiconductor including black phosphorous, graphene, or a transition metal dichalcogenide (TMD) such as molybdenum disulfide ($MoS_2$).

In accordance with another aspect of the present disclosure, a method for manufacturing a semiconductor device includes forming a fin structure comprising a 2D channel. A dummy gate is formed over the fin structure. The dummy gate partially covers the fin structure. A spacer layer is formed to cover the dummy gate and an exposed portion of the fin structure. The spacer layer is formed over the dummy gate and the dummy gate is removed to expose the fin structure underneath the dummy gate. A gate stack is formed over the exposed fin structure. Trenches for source and drain contacts are formed by removing a first portion of a height of the fin structure, and source and drain contacts of a fin FET are formed by filling the trenches with a metal.

In some implementations, forming the fin structure includes forming a fin on a substrate and selectively forming the 2D channel over the fin. The fin and the substrate include one of silicon (Si), silicon dioxide ($SiO_2$), or silicon covered with a dielectric material. The dielectric material includes one of boron nitride (BN), alumina ($Al_2O_3$), or hafnium oxide ($HfO_2$).

In accordance with yet another aspect of the present disclosure, a semiconductor device includes a Fin FET device including a fin structure protruding from a substrate layer and having a length extending in a first direction. A channel layer is formed on the fin structure. A gate stack including a gate electrode layer and a gate dielectric layer extending in a second direction perpendicular to the first direction is formed over the channel layer covering a portion of the length of the fin structure. Source and drain contacts are formed over trenches that extend into a portion of a height of the fin structure.

In some implementations, the source and drain contacts is a metallic filing that forms a side contact with the channel layer. The channel layer includes a thin layer of 2D semiconductor, and a thickness of the channel layer is about 2 nm. A height of the fin structure is about 50 nm, and the source and drain contacts are formed over trenches that extend into at least about 30% of the height of the fin structure.

The foregoing outline features several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a spacer layer over a dummy gate, formed over a first portion of a fin structure, and a second portion of the fin structure;
   forming a dielectric layer over the spacer layer;
   removing the dielectric layer and the spacer layer formed over the dummy gate to expose the first portion of the fin structure;
   forming a gate stack over the exposed first portion of the fin structure;
   forming trenches by removing the dielectric layer formed over a remaining portion of the spacer layer and a portion of a height of the fin structure underneath the dielectric layer; and
   forming source and drain contacts by filling the trenches with a metal.

2. The method of claim 1, further comprising forming the fin structure and the dummy gate prior to forming the spacer layer, wherein forming the fin structure comprises forming a 2D channel comprising a 2D material over a fin that is formed on a substrate, wherein the 2D material comprises a 2D semiconductor, and wherein the 2D semiconductor comprises black phosphorous, graphene, or a transition metal dichalcogenide (TMD) including molybdenum disulfide ($MoS_2$).

3. The method of claim 2, wherein forming the 2D channel comprises a selective deposition using one of a chemical-vapor deposition (CVD) method or an atomic-layer deposition (ALD) method, and wherein a thickness of the 2D channel is within a range of about 0.5 nm to 10 nm.

4. The method of claim 2, wherein the fin and the substrate comprise similar materials, wherein the substrate comprises one of silicon (Si), silicon dioxide ($SiO_2$), or silicon covered with a dielectric material, and wherein the dielectric material comprises one of boron nitride (BN), alumina ($Al_2O_3$), hafnium oxide ($HfO_2$).

5. The method of claim 2, wherein the spacer layer comprises silicon nitride (SiN) or silicon carbon nitride (SiCN), and wherein the spacer layer is formed using one of CVD, ALD, or physical vapor deposition (PVD).

6. The method of claim 2, wherein prior to forming the spacer layer, the 2D channel is treated by doping with chlorine ions ($Cl^-$).

7. The method of claim 1, wherein the dielectric layer comprises a first inter-layer deposition layer including silicon dioxide ($SiO_2$).

8. The method of claim 1, wherein forming the trenches comprises removing at least about 30% of the height of the fin structure underneath the dielectric layer.

9. The method of claim 8, wherein the height of the fin structure is within a range of about 10 nm to 100 nm, and wherein a width of each trench is within a range of about 1 nm to 100 nm.

10. A method for manufacturing a semiconductor device, comprising:
    forming a fin structure comprising a 2D channel;
    forming a dummy gate over the fin structure, the dummy gate partially covering the fin structure;
    forming a spacer layer to cover the dummy gate and an exposed portion of the fin structure;
    removing the spacer layer formed over the dummy gate to expose the fin structure underneath the dummy gate;
    forming a gate stack over the exposed fin structure;
    forming trenches for source and drain contacts by removing a first portion of a height of the fin structure; and
    forming source and drain contacts of a fin FET by filling the trenches with a metal.

11. The method of claim 10, wherein forming the fin structure comprises forming a fin on a substrate and selectively forming the 2D channel over the fin.

12. The method of claim 11, wherein the fin and the substrate comprise one of silicon (Si), silicon dioxide ($SiO_2$), or silicon covered with a dielectric material, and wherein the dielectric material comprises one of boron nitride (BN), alumina ($Al_2O_3$), or hafnium oxide ($HfO_2$).

13. The method of claim 11, wherein the 2D channel comprises a thin layer with a thickness within a range of about 0.5 nm to 10 nm of a transition metal dichalcogenide (TMD) formed by using one of a chemical-vapor deposition (CVD) method or an atomic-layer deposition (ALD) method.

14. The method of claim 10, further comprising forming a dielectric layer over the spacer layer, and wherein exposing the fin structure underneath the dummy gate further comprises removing the dielectric layer formed over the spacer layer, formed over the dummy gate.

15. The method of claim 14, wherein forming the trenches for the source and drain contacts comprise removing the dielectric layer and the first portion of the height of the fin structure underneath the dielectric layer, wherein the first portion comprises at least about 30% of the height of the fin structure.

16. The method of claim 15, wherein the height of the fin structure is within a range of about 10 nm to 100 nm, and wherein forming the trenches for the source and drain contacts comprise forming each trench with a width within a range of about 1 nm to 100 nm.

17. A method for manufacturing a semiconductor device, comprising:
    forming a spacer layer over a dummy gate, formed over a first portion of a fin structure, and a second portion of the fin structure;
    forming a dielectric layer over the spacer layer;
    removing the dielectric layer and the spacer layer formed over the dummy gate and the dummy gate to expose the first portion of the fin structure;
    forming a gate stack over the exposed first portion of the fin structure;
    forming trenches by partially cutting the fin structure in an out-of-plane direction; and
    forming source and drain contacts by filling the trenches with a metal.

18. The method of claim 17, further comprising forming the fin structure and the dummy gate prior to forming the spacer layer, wherein forming the fin structure comprises forming a 2D channel comprising a 2D material over a fin that is formed on a substrate, wherein the 2D material comprises a 2D semiconductor, and wherein the 2D semiconductor comprises black phosphorous, graphene, or a transition metal dichalcogenide (TMD) including molybdenum disulfide ($MoS_2$).

19. The method of claim 18, wherein forming the 2D channel comprises a selective deposition using one of a chemical-vapor deposition (CVD) method or an atomic-layer deposition (ALD) method, and wherein a thickness of the 2D channel is within a range of about 0.5 nm to 10 nm.

20. The method of claim 18, wherein the fin and the substrate comprise similar materials, wherein the substrate comprises one of silicon (Si), silicon dioxide ($SiO_2$), or silicon covered with a dielectric material, and wherein the dielectric material comprises one of boron nitride (BN), alumina ($Al_2O_3$), hafnium oxide ($HfO_2$).

* * * * *